United States Patent [19]
Doyle et al.

[11] Patent Number: 5,594,344
[45] Date of Patent: Jan. 14, 1997

[54] METHOD AND APPARATUS FOR GENERATING AND DETECTING AMPLITUDE AND PHASE MODULATED SENSOR SIGNALS

[75] Inventors: Mark R. Doyle; John T. Evans, both of Houston, Tex.

[73] Assignee: Western Atlas International, Inc., Houston, Tex.

[21] Appl. No.: 512,893

[22] Filed: Aug. 9, 1995

[51] Int. Cl.$^6$ .............................. G01V 3/30; G01V 3/18; G01R 13/02
[52] U.S. Cl. ........................................ 324/338; 324/76.55
[58] Field of Search ..................................... 324/338, 339, 324/340, 341, 342, 343, 354, 355, 359, 360, 76.52, 76.54, 76.55, 76.58, 76.59, 76.6, 76.77, 76.78, 76.82; 327/2, 4, 50; 329/345, 346

[56] References Cited

U.S. PATENT DOCUMENTS 5,548,219  8/1996  Sinclair ................................. 324/338

Primary Examiner—Walter E. Snow
Attorney, Agent, or Firm—Richard A. Fagin

[57] ABSTRACT

A method of extracting a phase and amplitude modulation signal impressed on a carrier is disclosed. The method includes generating the carrier at a frequency which is a multiple of the bandwidth of the modulation signal. The multiple equals 4N+1, where N is an integer. The modulation signal is impressed on the carrier, generating a phase and amplitude modulated carrier. The modulated carrier is digitally sampled at a frequency of four times the bandwidth the modulation signal. The digital sampling is initiated substantially contemporaneous with initiation of generating the carrier. A 90-degree phase shift is applied to the digitally sampled carrier to generate a quadrature component of the digitally sampled carrier. A time delay is applied to the digitally sampled carrier to restore time coincidence between the quadrature component and said digitally sampled carrier, and the phase and amplitude modulation signal is extracted by commutation of the time-delayed digitally sampled carrier and the quadrature component of the digitally sampled carrier. In a particular embodiment of the invention, the phase and amplitude can be extracted from the extracted signal.

21 Claims, 1 Drawing Sheet

METHOD AND APPARATUS FOR GENERATING AND DETECTING AMPLITUDE AND PHASE MODULATED SENSOR SIGNALS

BACKGROUND OF THE INVENTION

1. Field of the Invention

The present invention is related to the field of oil well logging instruments. More specifically, the present invention is related to apparatus within well logging tools which generate and detect signals which are amplitude and phase modulated in response to properties of earth formations.

2. Description of the Related Art

Oil well logging instruments are used to evaluate properties of earth formations surrounding wellbores drilled into the earth. Other logging instruments evaluate properties of fluids within the wellbore itself. One general class of well logging instruments includes devices which generate oscillating electromagnetic test signals. The test signals are imparted to the earth formations surrounding the wellbore, or to the fluids in the wellbore. A sensor, positioned on the tool to be responsive to the property of the formation or of the fluid, generates a signal which can be detected by various circuits in the tool. The amplitude and the phase of the signal generated by the sensor, relative to the original test signal, are indicative of the property being evaluated. For example, induction conductivity tools measure electrical conductivity of the earth formations by passing an oscillating current through transmitter coils on the logging instrument (tool). Receiver coils, positioned at appropriate locations along the tool, generate electrical voltages in response to the magnitude of currents induced in the earth formation, which currents themselves are indicative of the formation conductivity. In induction tools the amplitude of the sensor signal which is in phase with the test signal provides desirable information.

Another type of logging tool is used to determine the dielectric constant of the fluid in the wellbore. An oscillating test signal is conducted through a sensor which forms a parallel plate capacitor. The sensor is configured so that some of the fluid present in the wellbore moves between the plates. The capacitance of the sensor depends on the dielectric constant of the fluid in between the plates. Amplitude and phase difference from the amplitude and phase of the oscillating test signal depends on the capacitance of the sensor. The values of amplitude and phase difference can be used to calculate values of sensor capacitance, and therefore to estimate fractional volumes of water in the wellbore.

Systems for measuring amplitude and phase of the signal generated by the sensor are known in the art and include analog systems. Analog systems are described, for example in "Communication Systems and Techniques", M. Schwartz, W. Bennett and S. Stein, McGraw-Hill, New York, 1966. A drawback to using analog systems is that they typically require large, bulky components, which can be difficult to design to fit inside a well logging tool. Analog systems are also subject to inaccuracy resulting from temperature-induced drift in the ratings of system components.

It is also known in the art to substitute digital signal processing systems for analog systems. Digital signal processing systems are disclosed, for example, in "Multirate Digital Signal Processing", R. Crochiere and L. Rabiner, Prentice-Hall, Englewood Cliffs, N.J., 1983. Digital systems known in the art are computationally intensive particularly because calculation of phase and amplitude requires calculation of sine and cosine values at the signal frequency. Digital calculation of sine and cosine typically are performed using infinite series, which can be time consuming even on fast digital signal processing (DSP) processors. Digital systems known in the art are also difficult to synchronize with the original oscillating test signal, which makes accurate measurement of true phase change difficult.

It is an object of the present invention to provide a system for measuring the amplitude and phase of a sensor signal, generated in response to a test signal imparted to a medium under investigation, which requires much less digital computation and is synchronized to the test signal so that accuracy of phase measurement is improved.

SUMMARY OF THE INVENTION

The present invention is a method of extracting a phase and amplitude modulation signal impressed on a carrier. The method includes generating the carrier at a frequency which is a multiple of the bandwidth of the modulation signal. The multiple equals 4N+1, where N is an integer. The modulation signal is impressed onto the carrier, generating a phase and amplitude modulated carrier. The modulated carrier is digitally sampled at a frequency of four times the bandwidth of the modulation signal. The digital sampling is initiated substantially contemporaneous with initiation of generating the carrier. A 90-degree phase shift is applied to the digitally sampled carrier to generate a quadrature component of the digitally sampled carrier. A time delay is applied to the digitally sampled carrier to restore time coincidence between the quadrature component and said digitally sampled carrier, and the phase and amplitude modulation signal is extracted by commutation of the time-delayed digitally sampled carrier and the quadrature component of the digitally sampled carrier.

In a particular embodiment of the invention, the phase and amplitude can be extracted from the extracted signal.

DESCRIPTION OF THE PREFERRED EMBODIMENT

Figure 1:
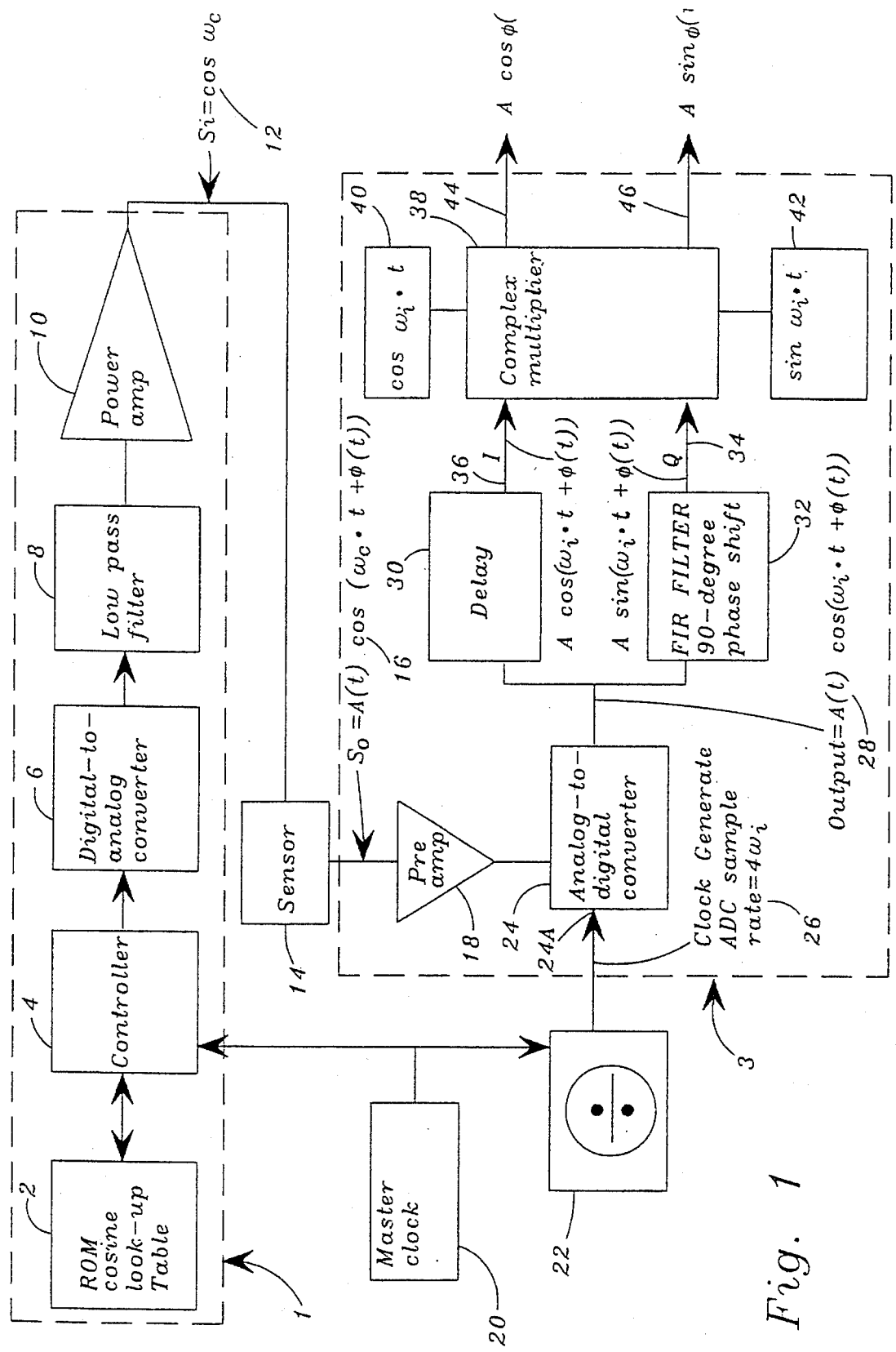
FIG. 1 shows a signal generation and detection apparatus according to the present invention.

The present invention can be better understood by referring to FIG. 1. A test signal generator, shown generally at 1, provides an oscillating test signal to a sensor 14. The oscillating test signal can have substantially constant frequency and phase. The sensor 14 modulates the test signal in response to changes in the value of a physical property to which the sensor is sensitive. For example, the sensor 14 in the present embodiment can be a capacitive probe used in oil well logging tools to determine the fractional volume of water filling a wellbore drilled through earth formations. As is understood by those skilled in the art, changes in fractional water volume to which the sensor is exposed cause changes in the capacitance of the probe. Changes in probe capacitance result in changes in the amount of phase shift and amplitude reduction at the signal output by the sensor 14 relative to the input from the generator 1.

It is to be understood that the example sensor 14 disclosed herein is provided only to illustrate the principle of the invention and is not to be construed as a limitation of the invention. It is contemplated that other types of sensors, for example, transmitters and receivers of an electromagnetic propagation resistivity tool used in measurement-while-drilling (MWD) operations would also be useful with the system of the present invention. In the case of the electromagnetic propagation resistivity tool, a time-varying electromagnetic field is induced in earth formations by passing the test signal through the transmitter. The receivers generate voltages corresponding to the magnitude of the field at locations spaced apart from the transmitter. The resistivity of the earth formations is calculated from the difference in phase and amplitude of the receiver voltages with respect to the test signal imparted to the transmitter, and as will be further explained, phase and amplitude are two measures which can be determined by the present invention. For similar reasons, it is also contemplated that transmitter and receiver coils used on induction resistivity logging tools could also be suitable for use with the present invention. Induction resistivity tools impart the test signal to transmitter coils on the tool. Receiver coils generate voltages corresponding to the magnitude of eddy currents induced in the earth formation by the transmitter coil. Magnitude of components of the receiver voltages which are 180 degrees out of phase with the test signal are indicative of the resistivity of the earth formation. The present invention, as will be explained, is well suited to determine the magnitudes of such components of the receiver voltages.

The output of the sensor 14 is conducted to a receiver, shown generally at 3 wherein are determined the variation in amplitude and phase, with respect to the test signal from the signal generator 1, of the signal output by the sensor 14.

The test signal generator 1 in the present embodiment preferably generates the test signal by digital-to-analog conversion. The test signal generator 1 includes a read only memory (ROM) 2 which can be programmed with a look-up table (not shown) containing numbers representing amplitude values of the test signal sampled at spaced apart time intervals. In the present embodiment the ROM 2 can be programmed with numbers representing a cosine function sampled at 80 equally spaced apart intervals. The ROM 2 is operationally connected to a controller 4. The controller 4 extracts the signal amplitude numbers from memory locations in the ROM 2 in a predetermined sequence and serially conducts the amplitude numbers to a digital-to-analog converter (DAC) 6. The DAC 6 converts the numbers into an analog voltage having a magnitude corresponding at any instant in time to the number conducted to it from the controller 4. The rate at which the controller 4 extracts new numbers and conducts them to the DAC 6 is determined by a master clock 20 which is connected to the controller 4. The master clock 20 in the present invention can have a frequency of 8.04 megahertz (mHz). The ROM 2, as previously explained, can have 80 individual amplitude values (numbers) per complete cycle of the cosine function programmed therein, so the DAC 6 will generate one complete analog voltage cycle at a rate of 100.5 kilohertz (kHz). The significance of the analog voltage rate output from the DAC 6 will be further explained. The output of the DAC 6 optionally can be conducted through an analog low pass filter 8 to remove high-frequency "stair-step" noise generated as an artifact of the digital-to-analog conversion, as is understood by those skilled in the art. The output from the low pass filter 8 can then be conducted to a power amplifier 10, which increases the signal amplitude and matches the signal generator 1 output impedance to that of the sensor 14, which is connected to the output of the generator 1. It is to be understood that the test signal generator 1 as disclosed herein including the DAC 6 and ROM 2 could be substituted by an analog oscillator while retaining the essential function of the present invention. The test signal generator 1 as disclosed herein is not meant to be an exclusive representation of all the types of test signal generator which would function with the present invention.

The signal, $S_i$, conducted to the sensor, as shown generally at 12, can be represented by the expression:

$$S_i = \cos(\omega_c t), \quad \omega_c = 2\pi f_c \qquad (1)$$

where $f_c$ is the so-called "carrier" frequency, which in the present embodiment represents the analog voltage cycle rate, and can be 100.5 kHz as previously explained. t represents time.

As previously explained, the sensor 14 can modulate the amplitude and phase of the test signal in response to changes in the physical property to which the sensor 14 is sensitive. In the present embodiment, the sensor 14, which can be a capacitance probe, is responsive to changes in the fractional volume of water in a fluid in contact with the sensor 14. The phase and amplitude modulation imparted by the sensor 14 are typically time-varying, since the fractional water volume is typically not constant, and as shown generally at 16, the output of the sensor, referred to as $S_o(t)$, can be described by the relationship:

$$S_o(t) = A(t)\cos(\omega_c t + \phi(t)) \qquad (2)$$

where A(t) represents the time-varying amplitude modulation and $\phi(t)$ represents the time-varying phase modulation. In the present embodiment of the invention, the capacitance probe sensor 14 will typically modulate the test signal within a frequency range of 0–500 Hz. The signal, $S_o$, returned to the receiver 3 after modulation by the sensor 14, occupies the frequency band from 100–101 kHz (100.5 kHz±500 Hz). It is to be understood that the modulation bandwidth (±500 Hz) of the sensor 14 in the present embodiment of the invention is provided only as an example to illustrate the operation of the present invention, and is not to be construed as a limitation on the invention. Other types of sensors may impart modulation having different bandwidths and carrier frequencies, but will function equally well according to the present invention.

The test signal generator 1 and the modulation imparted to the test signal by the sensor 14 having been explained, the operation of the receiver 3 will now be explained. The receiver 3 can include a preamplifier 18 to match the sensor 14 impedance, and to condition the signal from the sensor 14 to an appropriate amplitude level for connection to the input of an analog to digital converter (ADC) 24. The ADC 24 generates a digital word representing the amplitude of the signal input sampled at spaced apart time intervals. The spaced apart time intervals are determined by the rate at which clocking pulses are provided to a clock input 24A on the ADC 24.

In a novel aspect of the present invention, the master clock 20, which is connected to the controller 4 in the signal generator 1 and determines the test signal (or the "carrier") frequency, is also connected to a divider 22, which reduces the 8.04 mHz frequency of the master clock 20 down to 2 kHz for conduction to the clock input 24A of the ADC 24. Since the master clock 20 operates both the signal generator 1 and the ADC 24, the digital sampling of the sensor 14 signal can be synchronized to generation of the test signal.

It will be readily appreciated by those skilled in the art that the ADC 24 samples the sensor signal at a rate which aliases the frequency of the modulated test signal, $S_o$. The modulated test signal is aliased from the 100–101 kHz frequency band down to the 0–1 kHz frequency band. The 100.5 kHz carrier is aliased to 500 Hz. However, since the digital words (the samples) generated by the ADC 24 are generated at a rate which is a submultiple of the (test signal) carrier frequency $f_c$) and the samples are generated synchronously with the test signal carrier, the output of the ADC 24 will include substantially only a digital representation of the real component of the phase and amplitude modulation imparted to the test signal by the sensor 14 impressed on a 500 Hz intermediate frequency.

The output from the ADC 24, being in the form of discrete samples generated at spaced apart time intervals, can be represented by the expression:

$$I(n) = A(n\Delta T)\cos(\omega_i n \Delta t + \phi(n\Delta t)) \tag{3}$$

where n is an index number corresponding to each one of the digital samples, $\Delta t$ is the time interval between samples, which in the present embodiment can be 0.5 milliseconds (corresponding to the 2 kHz sample rate), and where $\omega_i$ is the carrier frequency after aliasing down to 500 Hz as a result of sampling at 2 kHz (multiplied by $2\pi$ for conversion to angular frequency) and which can be referred to as an intermediate frequency.

Extraction of the phase and amplitude modulation information requires a final demodulation of the 500 Hz intermediate frequency signal to zero frequency. Final demodulation can be performed by first conducting the output of the ADC 24 both to a delay buffer 30 and to a finite impulse response (FIR) filter 32. The FIR filter 32 provides a 90-degree phase shift to the incoming digitized signal from the ADC 24. The output of the FIR filter 32 represents the imaginary, or quadrature, component of the phase and amplitude modulated signal. The quadrature component of the signal Q(n) can be represented by the expression:

$$Q(n) = A(n\Delta t)\sin(\omega_i n\Delta t + \phi(n\Delta t)) \tag{4}$$

As is understood by those skilled in the art, the FIR filter 32 output will be delayed by a number of digital samples, M, (corresponding to a delay in time of $M\Delta t$) approximately one-half the filter length (which for digital filters is typically quantified by the number of input samples needed to generate one output sample). The delay buffer 30 provides substantial time-coincidence between the output of the FIR filter 32 representing the quadrature component of the modulated signal, and the output of the delay buffer 30 representing the in-phase component of the modulated signal. The delay line 30 output is shown generally at 36 and the FIR filter 32 output is shown generally at 34.

As is understood by those skilled in the art, the combination of the in-phase output 36 and the quadrature output 34 can be represented by an expression referred to as the analytic signal representation:

$$I(n) + jQ(n) = A(n\Delta T)e^{j(\omega_i n\Delta t + \phi(n\Delta t))}, j = \sqrt{-1} \tag{5}$$

As is also understood by those skilled in the art, down conversion of the intermediate frequency signal to zero frequency can be accomplished by multiplication of the intermediate frequency signal by the inverse: $\exp(-j\omega_i n\Delta t)$. As shown in FIG. 1, the complex multiplication can be performed in a complex multiplier 38. Complex multiplier inputs are shown generally at 40, the real component, and at 42 the imaginary, or quadrature component, of exp $(-j\omega_i n\Delta t)$.

In a novel aspect of the present invention, the step of complex multiplication can be replaced by commutation. The sample rate of the ADC 24 (2 kHz) is selected to be exactly four times the intermediate frequency (500 Hz). The values of the complex inverse multiplier, $\exp(-j\omega_i n\Delta t)$, can therefore only be 1, j, −1, or −j. The demodulated signal components, which can therefore only be 1, j, −1, or −j times the complex analytic signal representation $[I(n)+jQ(n)]$, can be selected from the in-phase and quadrature components of the modulated signal as shown in the following commutation table:

| n modulo 4 | $-\omega_i n\Delta t$ modulo $2\pi$ | exp $(-j\omega_i n\Delta t)$ | Real demodulated output | Imaginary demodulated output |
|---|---|---|---|---|
| 0 | 0 | 1 | I(n) | Q(n) |
| 1 | $3\pi/2$ | −j | Q(n) | −I(n) |
| 2 | $\pi$ | −1 | −I(n) | −Q(n) |
| 3 | $\pi/2$ | j | −Q(n) | I(n) |

The complex multiplier 38 therefore can be a commutator, which causes a sequence according to the commutation table to be conducted to the output terminals of the multiplier 38, the outputs shown as 44 (real component) and 46 (quadrature component).

It is also possible to perform simultaneously a decimation (or reduction in the number of digital samples) by a factor of two by sampling only the even numbered (n=0, or 2, modulo 4) I and Q components and applying the inverse sign to alternate outputs.

The phase and amplitude can be calculated, if desired, by the following expressions:

$$A(t) = \sqrt{[A(t)\cos\phi(t)]^2 + [A(t)\sin\phi(t)]^2} \tag{6}$$

and $$\phi(t) = \arctan \frac{A(t)\sin\phi(t)}{A(t)\cos\phi(t)} \tag{7}$$

Generally, the present invention requires that the bandwidth of the modulation signal, B, and the digital sample rate of the ADC 24, referred to as $f_s$, be related according to an expression in equation (8), infra. Digital representation of the information contained in the modulated carrier signal, which has bandwidth 2B, must be sampled at at least twice the bandwidth of the modulated carrier signal, as represented by the expressions:

$$f_s = 2 \times (2B), f_s = 4B \tag{8}$$

A modulated carrier signal having a range of frequencies ranging from $f_c - B$ to $f_c + B$, where $f_c$ is the carrier frequency and B is the modulation bandwidth, can be digitally sampled without distortion at a frequency of 4B, as long as the lower edge of the frequency range of the signal, $f_c - B$, is an integral multiple of the modulated carrier signal bandwidth 2B. It is desirable for the lower edge $f_c - B$ to be an even multiple of 2B so that "band reversal" is avoided, as explained for example in, "Multirate Digital Signal Processing", R. Crochiere and L. Rabiner, Prentice-Hall, Englewood Cliffs, N.J., 1983. If an odd multiple of 2B is selected, the band reversal can be removed by the additional step of multiplication by an alternating sequence of +1 and −1 as explained in the Crochiere reference, supra.

As is understood by those skilled in the art, digital sampling has the effect of aliasing all frequency bands which begin at multiples of the sample rate into a frequency band having a range from zero to one-half the sample rate $f_s$. If only one such band (beginning at a frequency which is a multiple of the sample rate) is present in the signal being sampled, then the aliasing shifts that band to begin at zero frequency. Therefore, the system according to the present invention can perform the function of demodulation and intermediate frequency demodulation by commutation if the modulation bandwidth and carrier frequency are selected according to the following relationship:

$$f_c - B = (2N) \times (2B), f_c = (4N+1)B \qquad (9)$$

where N can be selected to be any integer. In the example of the present embodiment of the invention B is 500 Hz, therefore from equation (8) the sample rate should be 2 kHz. The carrier frequency was selected to be near 100 kHz, so N was selected to be 50. Therefore 4 N+1=201 and $f_c$=100.5 kHz.

It is to be understood that the present invention would also perform as intended if the signal generator 1 were an analog oscillator synchronized to the operation of the ADC 24.

It is also contemplated that the generator 1 waveform could also be a square wave, rather than a sinusoid. The preamplifier 18 could then include filtering to remove harmonics of $f_c$ to enable recovery of a sinusoid prior to digital sampling and demodulation.

Those skilled in the art will be able to devise additional embodiments and improvements of the present invention which do not depart from the spirit of the invention disclosed herein. Therefore the present invention should be limited in scope only by the claims appended hereto.

What is claimed is:

1. A method of extracting a phase and amplitude modulation signal impressed on a carrier comprising the steps of:
    generating said carrier at a frequency, said frequency a multiple of a bandwidth of said phase and amplitude modulation signal, said multiple equal to 4N+1, where N is an integer;
    causing said modulation signal to be impressed on said carrier, thereby generating a phase and amplitude modulated carrier;
    digitally sampling said phase and amplitude modulated carrier, said digital sampling having a frequency of four times said bandwidth of said phase and amplitude modulation signal, said digital sampling initiated at a time substantially contemporaneous with initiation of said step of generating said carrier;
    applying a 90-degree phase shift to said digitally sampled carrier thereby generating a quadrature component of said digitally sampled carrier;
    applying a time delay to said digitally sampled carrier, said time delay restoring time coincidence between said quadrature component and said digitally sampled carrier; and
    extracting said phase and amplitude modulation signal by commutation of said time-delayed digitally sampled carrier and said quadrature component of said digitally sampled carrier.

2. The method as defined in claim 1 further comprising the step of determining the amplitude component of said modulation signal.

3. The method as defined in claim 1 further comprising the step of determining the phase component of said modulation signal.

4. The method as defined in claim 1 wherein said step of generating said carrier comprises digital to analog conversion of waveform data.

5. The method as defined in claim 1 wherein said step of generating said carrier comprises operating an analog signal oscillator.

6. The method as defined in claim 1 wherein said amplitude and phase modulation signal comprises a signal generated by a sensor in well logging tool.

7. The method as defined in claim 6 wherein said modulation signal corresponds to a physical property of an earth formation.

8. The method as defined in claim 7 wherein said property comprises fractional volume of water filling a wellbore.

9. The method as defined in claim 8 wherein said sensor comprises a capacitance probe.

10. The method as defined in claim 7 wherein said property comprises electrical resistivity of said earth formation.

11. The method as defined in claim 10 wherein said sensor comprises electromagnetic propagation resistivity transmitters and receivers.

12. An apparatus for generating and detecting amplitude and phase modulation imparted to an oscillating test signal, comprising:
    a test signal generator for generating said oscillating test signal at a predetermined frequency equal to 4N+1 times a bandwidth of said amplitude and phase modulation, where N is an integer;
    a source of said amplitude and phase modulation, said source imparted to said test signal, thereby generating an amplitude and phase modulated test signal;
    an analog to digital converter operatively coupled to said source, said analog to digital converter timed to generate digital samples of said sensor signal at a submultiple frequency of said predetermined frequency, said analog to digital converter timed to generate said digital samples substantially synchronously with initiation of cycles of said oscillating test signal, said submultiple frequency equal to four times said bandwidth;
    a filter coupled to an output of said analog to digital converter, said filter for applying a 90 degree phase shift to samples output from said analog to digital converter;
    a delay buffer coupled to said output of said converter, said delay buffer for providing substantial time coincidence between unfiltered output of said converter and an output of said filter having said 90 degree phase shift; and
    a commutator coupled to said output of said filter and an output of said delay buffer, said commutator providing outputs corresponding to 1, j, −1, −j times output of said buffer and said filter, said outputs of said commutator substantially representing said amplitude and phase modulation.

13. The apparatus as defined in claim 12 further comprising means for calculating the amplitude and phase components of said amplitude and phase modulation coupled to an output of said commutator.

14. The apparatus as defined in claim 12 wherein said test signal generator comprises a digital to analog converter and a read only memory operatively coupled to said digital to analog converter, said read only memory programmed with numbers representing magnitudes of said test signal sampled at spaced apart time intervals.

15. The apparatus as defined in claim 12 wherein said test signal generator comprises operating an analog signal oscillator.

16. The apparatus as defined in claim 12 wherein said source of said amplitude and phase modulation comprises a sensor in a well logging tool.

17. The apparatus as defined in claim 16 wherein said sensor generates said amplitude and phase modulation corresponding in magnitude to a value of a physical property of an earth formation.

18. The apparatus as defined in claim 17 wherein said property comprises fractional volume of water filling a wellbore.

19. The apparatus as defined in claim 18 wherein said sensor comprises a capacitance probe.

20. The apparatus as defined in claim 17 wherein said property comprises electrical resistivity of said earth formation.

21. The apparatus as defined in claim 20 wherein said sensor comprises electromagnetic propagation resistivity transmitters and receivers.

\* \* \* \* \*